(12) United States Patent
Yoshida et al.

(10) Patent No.: US 9,879,179 B2
(45) Date of Patent: Jan. 30, 2018

(54) FLUORESCENT MATERIAL, LIGHT-EMITTING DEVICE, AND METHOD FOR PRODUCING FLUORESCENT MATERIAL

(71) Applicant: NICHIA CORPORATION, Anan-shi, Tokushima (JP)

(72) Inventors: Masato Yoshida, Tokushima (JP); Koji Kajikawa, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/467,155

(22) Filed: Mar. 23, 2017

(65) Prior Publication Data
US 2017/0283695 A1 Oct. 5, 2017

(30) Foreign Application Priority Data

Mar. 30, 2016 (JP) ................................. 2016-068292
Feb. 16, 2017 (JP) ................................. 2017-027027

(51) Int. Cl.
| | |
|---|---|
| H01L 33/50 | (2010.01) |
| C09K 11/61 | (2006.01) |
| C09K 11/77 | (2006.01) |
| C09K 11/02 | (2006.01) |
| H01L 33/56 | (2010.01) |

(52) U.S. Cl.
CPC .......... *C09K 11/617* (2013.01); *C09K 11/025* (2013.01); *C09K 11/7709* (2013.01); *H01L 33/504* (2013.01); *H01L 33/56* (2013.01)

(58) Field of Classification Search
CPC ........ H01L 33/50; H01L 33/504; H01L 33/56
USPC ........................................................... 257/98
See application file for complete search history.

(56) References Cited

U.S. PATENT DOCUMENTS

| | | | | |
|---|---|---|---|---|
| 8,916,893 B2 * | 12/2014 | Ooyabu | ................. | B82Y 30/00 257/98 |
| 8,974,696 B2 | 3/2015 | Kaneyoshi et al. | | |

FOREIGN PATENT DOCUMENTS

| | | |
|---|---|---|
| JP | 2010-023880 A | 2/2010 |
| JP | 2010-275426 A | 12/2010 |
| JP | 2012-224536 A | 11/2012 |
| JP | 2015-515118 A | 5/2015 |
| WO | 2013-121355 A1 | 8/2013 |

* cited by examiner

Primary Examiner — Monica D Harrison
(74) Attorney, Agent, or Firm — Andrews Kurth Kenyon LLP

(57) ABSTRACT

A method for producing a fluorescent material can be provided. The method includes preparing fluorescent material particles that contain a fluoride having a composition including Mn, at least one selected from the group consisting of alkali metal elements and $NH_4^+$, and at least one selected from the group consisting of Group 4 elements and Group 14 elements; causing at least one cation selected from rare-earth elements and a phosphate ion to come into contact with each other in a liquid medium containing the fluorescent material particles to obtain rare-earth phosphate-adhered fluorescent material particles including the fluorescent material particles to which the rare-earth phosphate is adhered; and separating the rare-earth phosphate-adhered fluorescent material particles from the liquid medium.

13 Claims, 3 Drawing Sheets

US 9,879,179 B2

FLUORESCENT MATERIAL, LIGHT-EMITTING DEVICE, AND METHOD FOR PRODUCING FLUORESCENT MATERIAL

CROSS-REFERENCE TO RELATED APPLICATIONS

This application claims the benefit of Japanese Patent Application No. 2016-068292, filed on Mar. 30, 2016, and Japanese Patent Application No. 2017-027027, filed on Feb. 16, 2017, the disclosures of which are hereby incorporated by reference in their entirety.

BACKGROUND

Technical Field

The present disclosure relates to a fluorescent material, a light-emitting device, and a method for producing the fluorescent material.

Description of the Related Art

A light emitting diode (LED) is a semiconductor light-emitting element (hereinafter also referred to as "light-emitting element") produced from a metal compound such as gallium nitride (GaN). Many types of light-emitting devices that emit light of, for example, white color, incandescent bulb color, and orange color have been developed using such a light-emitting element in combination with a fluorescent material. Such light-emitting devices emit, for example, white light as a mixture of three primary colors of light. For example, light-emitting devices that emit white light by using a light-emitting element that emits blue light and a fluorescent material that emits yellow light are used in a variety of applications, including general lighting, backlighting for liquid crystal displays, in-vehicle lighting, and displays.

Red fluorescent materials having an excitation band in the blue region, and an emission peak with a narrow half bandwidth are known. Examples of such red fluorescent materials include fluoride fluorescent materials having a composition of $K_2SiF_6:Mn^{4+}$. Improved methods for producing these materials have been studied (e.g., JP 2012-224536).

SUMMARY

A first aspect of the present disclosure includes a method for producing a fluorescent material including preparing fluorescent material particles that contain a fluoride having a composition including Mn, at least one selected from the group consisting of alkali metal elements and $NH_4^+$, and at least one selected from the group consisting of Group 4 elements and Group 14 elements; causing at least one cation selected from rare-earth elements and a phosphate ion to come into contact with each other in a liquid medium containing the fluorescent material particles to obtain rare-earth phosphate-adhered fluorescent material particles including the fluorescent material particles to which the rare-earth phosphate is adhered; and separating the rare-earth phosphate-adhered fluorescent material particles from the liquid medium. According to an embodiment of the present disclosure, a highly durable red light-emitting fluorescent material, a light-emitting device including such a fluorescent material, and a method for producing the fluorescent material can be provided.

DETAILED DESCRIPTION

Figure 1A:
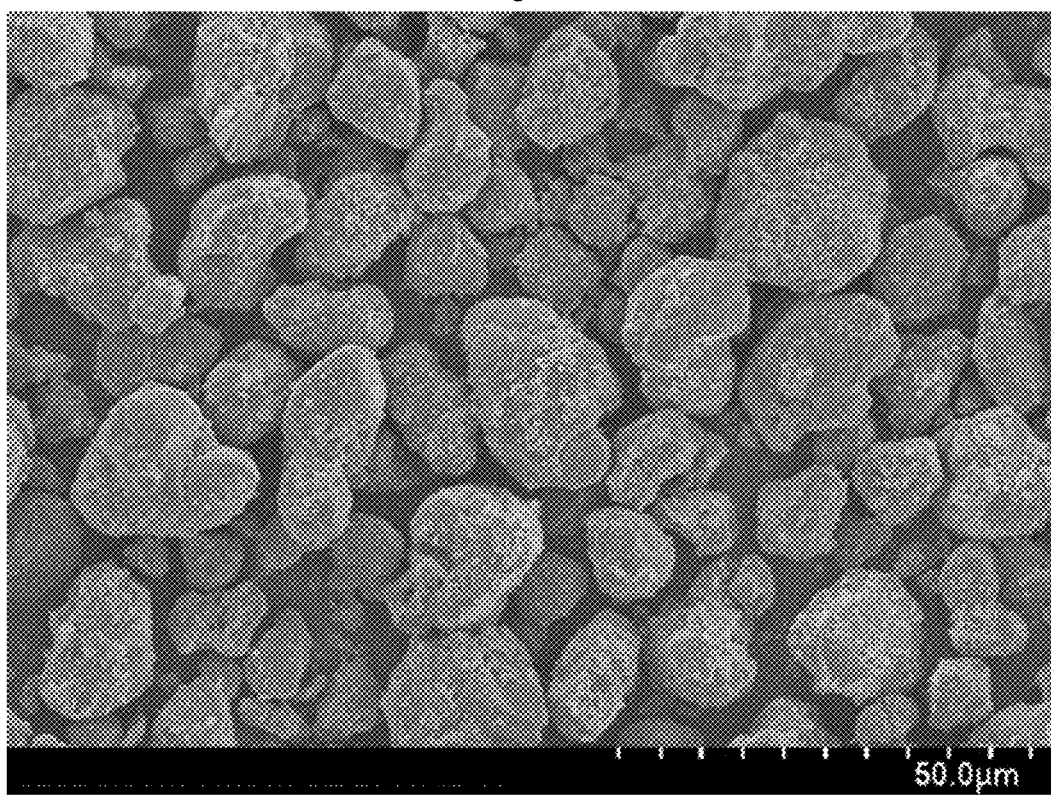
FIG. 1A is a scanning electron microscope (SEM) image of an exemplary fluorescent material according to an embodiment of the present disclosure.

A first aspect of the present disclosure includes a method for producing a fluorescent material including preparing fluorescent material particles that contain a fluoride having a composition including Mn, at least one selected from the group consisting of an alkali metal elements and $NH_4^+$, and at least one selected from the group consisting of Group 4 elements and Group 14 elements; causing at least one cation selected from rare-earth elements and a phosphate ion to come into contact with each other in a liquid medium containing the fluorescent material particles to obtain rare-earth phosphate-adhered fluorescent material particles including the fluorescent material particles to which the rare-earth phosphate is adhered; and separating the rare-earth phosphate-adhered fluorescent material particles from the liquid medium.

A second aspect of the present disclosure is a fluorescent material including fluorescent material particles that contain a fluoride having a composition including Mn, at least one selected from the group consisting of alkali metal elements and $NH_4^+$, and at least one selected from the group consisting of Group 4 elements and Group 14 elements, and a rare-earth phosphate arranged on the fluorescent material particles.

A third aspect of the present disclosure is a light-emitting device including a fluorescent member containing a fluorescent material and a resin, and a light-emitting element having a peak emission wavelength in a wavelength range of 380 nm to 470 nm. The fluorescent material includes a fluorescent material according to the second aspect of the present disclosure.

Light-emitting devices known in the art still need to be improved in durability for use in harsh environments, such as use for lighting. According to an embodiment of the present disclosure, a highly durable red light-emitting fluorescent material, a light-emitting device including such a fluorescent material, and a method for producing the fluorescent material can be provided.

A fluorescent material according to the present disclosure, a method for producing the fluorescent material, and a light-emitting device will now be described. However, the embodiments described below are mere examples for embodying the technical concept of the present invention, and the present invention is not limited to these. The relationship between the color names and the chromaticity coordinates, the relationship between the wavelength ranges of light and the color names of monochromatic light, and others are in accordance with Japanese Industrial Standard (JIS) Z8110. As used herein, the term "step" means not only an independent step but also a step which cannot be clearly distinguished from the other steps but that can achieve the desired object. For the amount of each component contained in a composition, when a plurality of substances corresponding to the component exist, the amount of the component means the total amount of the substances present in the composition unless otherwise specified.

Method for Producing Fluorescent Material

The method for producing a fluorescent material according to a first aspect of the present disclosure includes preparing fluorescent material particles that contain a fluoride having a composition including Mn, at least one selected from the group consisting of an alkali metal element and $NH_4^+$, and at least one selected from the group consisting of Group 4 elements and Group 14 elements (hereinafter also referred to as "preparation step"); causing at least one cation selected from rare-earth elements and a phosphate ion to come into contact with each other in a liquid medium containing the fluorescent material particles to obtain rare-earth phosphate-adhered fluorescent material particles including the fluorescent material particles to which the rare-earth phosphate is adhered (hereinafter also referred to as "adhesion step", the particles to which the rare-earth phosphate is adhered is referred to as "rare-earth phosphate-adhered fluorescent material particles"); and separating the rare-earth phosphate-adhered fluorescent material particles from the liquid medium (hereinafter also referred to as "separation step").

The fluorescent material is obtained by a specific method that causes a rare-earth phosphate to adhere to fluorescent material particles containing a fluoride having a specific composition. A light-emitting device including the fluorescent material can be highly durable. For example, a light-emitting device may include a fluorescent member that includes the fluorescent material and a resin, and that covers a light-emitting element. Durability as used herein means that a decline in the output and a change in the chromaticity over time in such a light-emitting device that emits light is reduced even when a high electric current is applied to the light-emitting element. Thus, the initial performance of the light-emitting device is maintained over a long period. In the light-emitting devices known in the art, the resin may fail to sufficiently cure presumably by the influence of a component contained in the composition of the fluoride, for example, an alkali metal. However, using the rare-earth phosphate-adhered fluoride fluorescent material particles may reduce the influence of the composition of the fluoride, and allow the resin included in the fluorescent member to sufficiently cure around its interface with the fluorescent material. This causes a better adhesion between the fluorescent material and the resin. The good adhesion may prevent the fluorescent material from separating from the resin even when the resin in the fluorescent member expands due to an increase in temperature of the light-emitting device operated at a high electric current. If the fluorescent material detaches from the resin in the fluorescent member, a space is formed between the fluorescent material and the resin. Such a space may cause scattering of light around the interface, reducing the amount of the incident excitation light into the fluorescent material. This may eventually cause a decrease in the amount of light taken from the fluorescent material to the outside of the light-emitting device.

In an embodiment, the rare-earth phosphate is directly adhered to the fluorescent material particles in a liquid medium. This is considered to further improve adhesion between the fluorescent material and the resin, and thus a light-emitting device including the fluorescent material can be highly durable.

Preparation Step

In the preparation step, fluorescent material particles that contain a fluoride having a composition including Mn, at least one selected from the group consisting of alkali metal elements and $NH_4^+$, and at least one selected from the group consisting of Group 4 elements and Group 14 elements are prepared. Such fluorescent material particles may be prepared by either appropriately selecting commercial products or producing as desired.

The fluorescent material particles including a fluoride includes Mn, at least one selected from the group consisting of alkali metal elements and $NH_4^+$, and at least one selected from the group consisting of Group 4 elements and Group 14 elements in its composition, and preferably includes at least potassium (K) and silicon (Si) in its composition. The fluoride preferably has a composition represented by formula (1):

$$A_2[M_{1-p}Mn^{4+}{}_pF_6] \tag{1}$$

In formula (1), A is at least one selected from the group consisting of alkali metal elements and $NH_4^+$; M is at least one selected from the group consisting of Group 4 elements and Group 14 elements; and p satisfies 0<p<0.2.

In formula (1), A is at least one selected from the group consisting of alkali metal elements and $NH_4^+$, and preferably at least one selected from the group consisting of lithium (Li), sodium (Na), potassium (K), rubidium (Rb), cesium (Cs), and ammonium ($NH_4^+$). Or A may include at least K, and further include at least one selected from the group consisting of Li, Na, Rb, Cs, and $NH_4^+$. Still more preferably, A is, for example, an alkali metal containing K as a main component. As used herein, "containing K as a main component" means that the potassium content of A in formula (1) is 80% by mol or more, preferably 90% by mol or more, and more preferably 95% by mol or more.

In formula (1), M is selected from the group consisting of Group 4 elements and Group 14 elements. In consideration of emission properties, M is preferably at least one selected from the group consisting of titanium (Ti), zirconium (Zr), hafnium (Hf), silicon (Si), germanium (Ge), and tin (Sn). More preferably, M contains silicon (Si), or both silicon (Si) and germanium (Ge), and still more preferably M is composed of silicon (Si), or silicon (Si) and germanium (Ge).

When M contains silicon (Si), or silicon (Si) and germanium (Ge), at least a portion of one of Si and Ge may be replaced with at least one selected from the group consisting of Group 4 elements, which include Ti, Zr, and Hf, and Group 14 elements, which include C and Sn. In that case, the total Si+Ge content of M is preferably, for example, 90% by mol or more, and more preferably 95% by mol or more.

In formula (1), p satisfies 0<p<0.2. In consideration of emission efficiency and emission intensity, p is, for example, 0.01 or more, 0.015 or more, 0.02 or more, or 0.03 or more, and p is also, for example, less than 0.2, 0.15 or less, or 0.1 or less. In addition, for example, p preferably satisfies 0.01≤p<0.2, more preferably satisfies 0.015≤p≤0.15, still more preferably satisfies 0.02≤p≤0.1, and further preferably satisfies 0.03≤p=0.1.

The particle diameter of the fluorescent material particles is, for example, as a volumetric average particle diameter, 1 μm or more, 5 μm or more, or 20 μm or more, and is also, for example, 100 μm or less or 70 μm or less. The particle size distribution of the fluorescent material particles preferably has a single peak in this range, and more preferably has a narrow distribution width. Using the fluorescent material particles having a volumetric average particle diameter equal to or greater than the lower limit may improve the emission intensity and the durability. Using the fluorescent material particles having a volumetric average particle diameter equal to or less than the upper limit may improve the workability in producing a light-emitting device. The volumetric average particle diameter of the fluorescent material particles is a particle diameter (median size) determined by a laser diffraction particle size analyzer (MASTER SIZER 2000 by Malvern Instruments).

The fluoride is an $Mn^{4+}$-activated fluorescent material, and can emit red light by absorbing visible light at short-wavelengths. The excitation light which is visible light at short-wavelengths is preferably mainly in the blue color region. Specifically, the excitation light preferably has a main peak wavelength in its intensity spectrum in the range of 380 nm to 500 nm, more preferably in the range of 380 nm to 485 nm, still more preferably in the range of 400 nm to 485 nm, and particularly preferably in the range of 440 nm to 480 nm. Setting the main peak wavelength in the range may improve emission efficiency of the fluorescent material.

The fluorescent material containing the fluoride preferably has a peak wavelength in its emission spectrum in the range of 610 nm to 650 nm. The half bandwidth of the emission spectrum is preferably narrow, and specifically preferably 10 nm or less.

Adhesion Step

In the adhesion step, at least one cation selected from rare-earth elements (hereinafter also referred to as "rare-earth metal ion") and a phosphate ion are caused to come into contact with each other in a liquid medium containing the prepared fluorescent material particles. This allows a rare-earth phosphate to adhere to the surfaces of the fluorescent material particles to yield rare-earth phosphate-adhered fluorescent material particles. Causing the rare-earth phosphate to adhere to the fluorescent material particles in a liquid medium is considered to allow the rare-earth phosphate to, for example, further uniformly adhere to the surfaces of the fluorescent material particles.

The liquid medium should dissolve phosphate ions and rare-earth metal ions. The liquid medium preferably contains at least water because ions are readily soluble in water. The liquid medium may further contain a reducing agent, such as hydrogen peroxide; an organic solvent; a pH adjuster; or other agents as appropriate. Examples of the organic solvent that may be contained in the liquid medium include alcohols, such as ethanol and isopropanol. Examples of the pH adjuster include basic compounds, such as ammonia, sodium hydroxide, and potassium hydroxide; and acidic compounds, such as hydrochloric acid, nitric acid, sulfuric acid, and acetic acid. When the liquid medium contains a pH adjuster, the pH of the liquid medium is, for example, 1 to 6, and preferably 1.5 to 4. When the pH is equal to or greater than the lower limit, the rare-earth phosphate may sufficiently adhere to the fluorescent material particles. When the amount is equal to or less than the upper limit, deterioration of the emission properties of the fluorescent material may be reduced. When the liquid medium contains water, the water content of the liquid medium is, for example, 70% by mass or more, preferably 80% by mass or more, and more preferably 90% by mass or more.

The mass percentage of the liquid medium to the mass of the fluorescent material particles is, for example, 100% by mass or more, or 200% by mass or more, and, for example, 1000% by mass or less, or 800% by mass or less. When the mass percentage of the liquid medium is equal to or greater than the lower limit, the rare-earth phosphate can more uniformly adhere to the surfaces of the fluorescent material particles. When the mass percentage of the liquid medium is equal to or less than the upper limit, the adhesion rate of the rare-earth phosphate to the fluorescent material may further improve.

The liquid medium preferably contains a phosphate ion, and more preferably contains water and a phosphate ion. When the liquid medium contains a phosphate ion, the prepared fluorescent material particles and the liquid medium, and further a solution containing a rare-earth metal ion may be mixed together to cause the phosphate ion to come into contact with the rare-earth metal ion in the liquid medium containing the fluorescent material particles. When the liquid medium contains a phosphate ion, the phosphate ion content of the liquid medium is, for example, 1% by mass or more, and preferably 2% by mass or more, and, for example, 10% by mass or less, and preferably 7% by mass or less. When the phosphate ion content of the liquid medium is equal to or greater than the lower limit, the amount of the liquid medium is not excessive, and the elution of the composition components of the fluorescent material is reduced. This allows the fluorescent material to maintain good properties. When the phosphate ion content of the liquid medium is equal to or less than the upper limit, the rare-earth phosphate may more uniformly adhere to the fluorescent material. Examples of the phosphate ion include orthophosphate ion, polyphosphate (metaphosphate) ion, phosphite ion, and hypophosphite ion. Examples of the polyphosphate ion include linear polyphosphate ions, such as pyrophosphate ion and tripolyphosphate ion, and cyclic polyphosphate ions, such as hexametaphosphate ion.

To prepare a liquid medium containing the phosphate ion, a compound intended to be used as a phosphate ion source may be dissolved in a liquid medium, or a solution containing a phosphate ion source may be mixed with a liquid medium. Examples of the phosphate ion source include phosphoric acid; metaphosphoric acid; alkali metal salts of phosphoric acid, such as sodium phosphate and potassium phosphate; alkali metal salts of hydrogen phosphoric acid, such as sodium hydrogenphosphate and potassium hydrogenphosphate; alkali metal salts of dihydrogen phosphoric acid, such as sodium dihydrogen phosphate and potassium dihydrogen phosphate; alkali metal salts of hexametaphosphoric acid, such as sodium hexametaphosphate and potassium hexametaphosphate; alkali metal salts of pyrophosphoric acid, such as sodium pyrophosphate and potassium pyrophosphate; and ammonium salts of phosphoric acid, such as ammonium phosphate.

The liquid medium preferably contains a reducing agent, more preferably contains water and a reducing agent, and still more preferably contains water, a phosphate ion, and a reducing agent. Using a liquid medium containing a reducing agent can effectively decrease precipitation of, for example, manganese dioxide derived from $Mn^{4+}$, which is contained in the fluoride of the fluorescent material particles. Any reducing agent capable of reducing $Mn^{4+}$, which may otherwise elute from the fluoride into the liquid medium, may be contained in the liquid medium. Examples of such a reducing agent include hydrogen peroxide, oxalic acid, and hydroxylammonium chloride. Of these, hydrogen peroxide is preferable because hydrogen peroxide dissolves in water, leaving no adverse effect on the fluoride.

To prepare a liquid medium containing the reducing agent, a compound that serves as the reducing agent may be dissolved in a liquid medium, or a solution containing the reducing agent may be mixed with a liquid medium. The reducing agent content of the liquid medium is not particularly limited. For the reasons described above, the reducing agent content is, for example, 0.1% by mass or more, and preferably 0.3% by mass or more.

Examples of the rare-earth element that forms a rare-earth metal ion to come into contact with a phosphate ion include, in addition to Sc and Y, lanthanoid elements, which consist of La, Ce, Pr, Nd, Pm, Sm, Eu, Gd, Tb, Dy, Ho, Er, Tm, Yb, and Lu. At least one selected from lanthanoid elements is preferable, and at least one selected from the group consisting of La, Ce, Dy and Gd is more preferable.

The phosphate ion and the rare-earth metal ion may be caused to come into contact with each other in a liquid medium, for example, by dissolving a compound that serves as a rare-earth metal ion source in a liquid medium containing the phosphate ion, or by mixing a liquid medium containing the phosphate ion and a solution containing the rare-earth metal ion. The solution containing the rare-earth metal ion can be prepared by, for example, dissolving a compound that serves as the rare-earth metal ion in a solvent, such as water. The compound that serves as the rare-earth metal ion source is, for example, a metal salt containing a rare-earth element. Examples of the anion to be included in the metal salt include nitrate ion, sulphate ion, acetate ion, and chloride ion.

Causing the phosphate ion and the rare-earth metal ion to come into contact with each other in a liquid medium may include, for example, mixing a liquid medium containing the phosphate ion, preferably further containing the reducing agent with the fluorescent material particles to prepare a fluorescent material slurry; and mixing the fluorescent material slurry with a solution containing the rare-earth metal ion.

The rare-earth metal ion content of a liquid medium in which the phosphate ion and the rare-earth metal ion are caused to come into contact with each other is, for example, 0.05% by mass or more, or 0.1% by mass or more, and, for example, 3% by mass or less, or 2% by mass or less. The rare-earth metal ion content relative to the amount of the fluorescent material particles in the liquid medium is, for example, 0.2% by mass or more, or 0.5% by mass or more, and, for example, 30% by mass or less, or 20% by mass or less. Using a liquid medium with a rare-earth metal ion content being equal to or greater than the lower limit may allow the rare-earth phosphate to better adhere to the fluorescent material. Using a liquid medium with a rare-earth metal ion content being equal to or less than the upper limit may allow the rare-earth phosphate to more readily uniformly adhere to the surfaces of the fluorescent material particles.

The temperature at which the phosphate ion and the rare-earth metal ion for forming the rare-earth phosphate are caused to come into contact with each other is, for example, 10° C. to 50° C., and preferably 20° C. to 35° C. The duration of contact is, for example, 1 min to 1 hour, and preferably 3 min to 30 min. The contact may be carried out while stirring the liquid medium.

Separation Step

In the separation step, the resulting rare-earth phosphate-adhered fluorescent material particles are separated from the liquid medium to yield a desired fluorescent material. The separation may be carried out using, for example, solid-liquid separation means, such as filtering and centrifugal separation. The fluorescent material obtained through the solid-liquid separation may undergo treatments such as washing and drying as appropriate. The washing treatment may be carried out using, for example, an alcohol, such as ethanol or isopropyl alcohol; a ketonic solvent, such as acetone; or water. The drying treatment may be carried out at room temperature, or with heating. The heating in the drying treatment may be carried out, for example at a temperature of 95° C. to 115° C. The duration of the drying may be, for example, 8 hours to 20 hours.

Fluorescent Material

The fluorescent material according to a second aspect of the present disclosure includes fluorescent material particles containing a fluoride (hereinafter also referred to as "core particles") and a rare-earth phosphate arranged on the fluorescent material particles. The fluoride has a composition including Mn, at least one selected from the group consisting of alkali metal elements and $NH_4^+$, and at least one selected from the group consisting of Group 4 elements and Group 14 elements. Arranging the rare-earth phosphate on the fluorescent material particles may improve, for example, adhesion or cohesion between the fluorescent material and the resin in a fluorescent member included in a light-emitting device. Improved adhesion or cohesion allows the light-emitting device to be more durable.

The details of the fluorescent material particles containing the fluoride, and the rare-earth phosphate included in the fluorescent material are as described above. In the fluorescent material, the rare-earth phosphate is adhered to and arranged on the core particles. The adhesion of the rare-earth phosphate to the core particles may be carried out by means of, for example, a physical interaction, such as van der Waals force or a static interaction, or a chemical interaction caused by a partial chemical reaction. The rare-earth phosphate may be adhered to the core particles in the form of a film or particles. In consideration of durability, at least a part of the rare-earth phosphate is preferably adhered to the core particles in the form of a film. As used herein, the rare-earth phosphate being arranged in the form of a film means that 50% or more, preferably 70% or more of the area of the surfaces of the core particles is covered with the rare-earth phosphate.

The amount of the rare-earth phosphate arranged on the core materials in the fluorescent material is, for example, 0.05% by mass or more, 0.1% by mass or more, 0.5% by mass or more, 0.8% by mass or more, 1% by mass or more, or 2% by mass or more in terms of the rare-earth metal element content. The rare-earth metal element content is also, for example, 20% by mass or less, 16% by mass or less, 14% by mass or less, 10% by mass or less, or 8% by mass or less. When the amount of the rare-earth phosphate arranged is equal to or greater than the lower limit, the fluorescent material may be durable enough. When the amount of the rare-earth phosphate arranged is equal to or less than the upper limit, deterioration of the emission properties of the fluorescent material may be reduced.

The rare-earth metal element content and the phosphate ion content included in the rare-earth phosphate in the fluorescent material can be determined by ICP-AES (high-frequency inductively coupled plasma emission spectral analysis method).

The particle diameter and the particle size distribution of the fluorescent material reflect the characteristics of the particle diameter and the particle size distribution of the core particles. The particle diameter of the fluorescent material is, for example, 1 μm or more, 5 μm or more, or 20 μm or more, and, for example, 100 μm or less, or 70 μm or less. The fluorescent material having a particle diameter equal to or greater than the lower limit may have improved emission intensity and durability. The fluorescent material having a particle diameter equal to or less than the upper limit may have improved workability in producing a light-emitting device.

Light-Emitting Device

The light-emitting device includes a fluorescent member containing the fluorescent material (hereinafter also referred to as "first fluorescent material") and a resin, and a light-emitting element having a peak emission wavelength in a wavelength range of 380 nm to 470 nm. Combining the fluorescent member including the fluorescent material with a light-emitting element can provide a highly durable light-emitting device. The fluorescent member may further include a second fluorescent material having a peak emission wavelength in a wavelength range of 500 nm to 580 nm.

Figure 3:
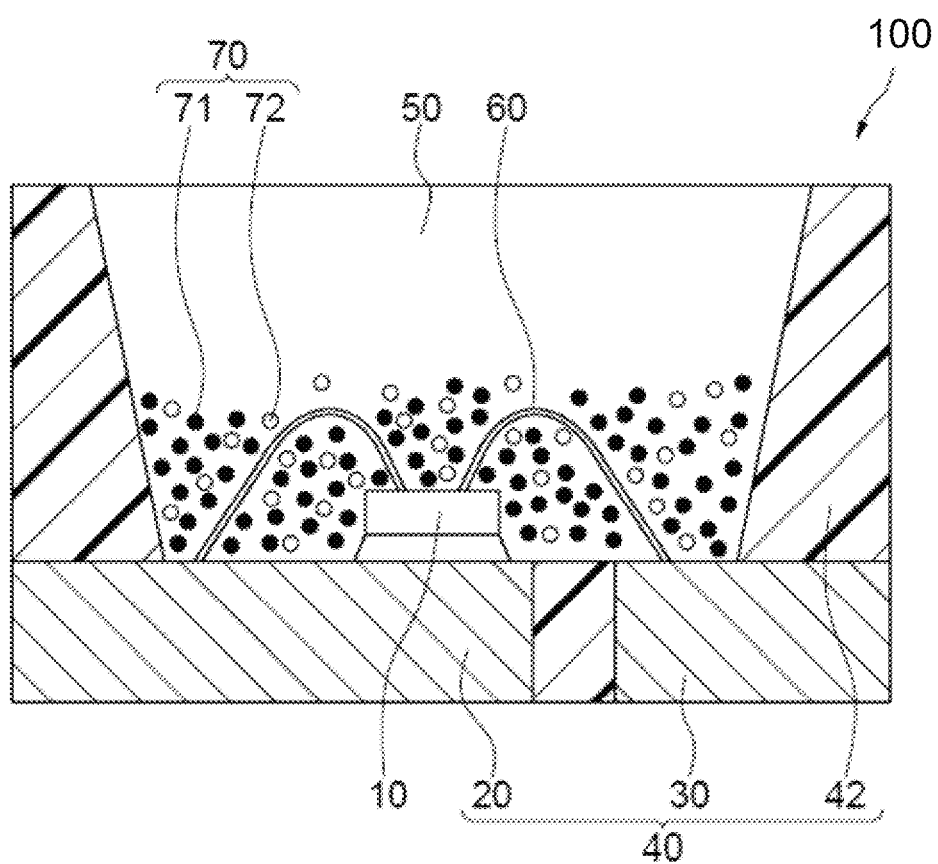
FIG. 3 is a schematic cross-sectional view of an exemplary light-emitting device according to an embodiment of the present disclosure.

A light-emitting device 100 according to an embodiment of the present disclosure will now be described with reference to FIG. 3. FIG. 3 is a schematic cross-sectional view of the light-emitting device 100. The light-emitting device 100 is an example of a surface mounting type light-emitting device. The light-emitting device 100 includes a light-emitting element 10 formed from a gallium nitride compound semiconductor, and a molded body 40 on which the light-emitting element 10 is disposed. The light-emitting element 10 emits visible light at short-wavelengths (e.g., a range of from 380 nm to 485 nm) and has a peak emission wavelength in the range of 430 nm to 470 nm. The molded body 40 includes a first lead 20 and a second lead 30, and a resin portion 42 including a thermoplastic or thermosetting resin in an integral manner. The molded body 40 has a recess defined by a bottom surface and side surfaces, and the light-emitting element 10 is disposed on the bottom surface of the recess. The light-emitting element 10 has a pair of electrodes, positive and negative, and the positive and negative electrodes are electrically connected to the first lead 20 and the second lead 30, respectively, with a wire 60. The light-emitting element 10 is covered with a fluorescent member 50. As shown in FIG. 3, the fluorescent member 50 includes, for example, a first fluorescent material 71 and a second fluorescent material 72 as a fluorescent material 70, and a resin.

The fluorescent member 50 serves not only as a member to convert the wavelength of light emitted from the light-emitting element 10, but also as a member to protect the light-emitting element 10 from the outside environment. In FIG. 3, the particles of the fluorescent material 70 are unevenly dispersed in the fluorescent member 50. Arranging the particles of the fluorescent material 70 closer to the light-emitting element 10 in this manner allows the fluorescent material 70 to efficiently convert the wavelength of light from the light-emitting element 10 so as to provide a light-emitting device with high light-emitting efficiency. It should be noted, however, that the arrangement of the fluorescent member 50 including the particles of the fluorescent material 70 and the light-emitting element 10 is not limited to one in which they are in close proximity to each other, and the particles of the fluorescent material 70 may be arranged spaced apart from the light-emitting element 10 within the fluorescent member 50 to avoid the influence of heat on the fluorescent material 70. The fluorescent material 70 may also be approximately evenly dispersed in the entire fluorescent member 50 to obtain light with reduced color unevenness.

Light-Emitting Element

The peak emission wavelength of the light-emitting element is in the range of 380 nm to 470 nm, preferably in the range of 440 nm to 460 nm, and more preferably in the range of 445 nm to 455 nm in consideration of the emission efficiency of the light-emitting device. A light-emitting device that emits mixed light of light from light-emitting element and fluorescent light from the fluorescent material is formed using such a light-emitting element as an excitation light source.

The half bandwidth of the emission spectrum of the light-emitting element can be, for example, 30 nm or less. For the light-emitting element, a semiconductor light-emitting element, such as an LED, is preferably used. Using a semiconductor light-emitting element as the light source may provide a highly efficient light-emitting device that has high output linearity to the input and is resistant and stable to mechanical impact. As the semiconductor light-emitting element, for example, a semiconductor light-emitting element that includes a nitride semiconductor ($In_XAl_YGa_{1-X-Y}N$, wherein X and Y satisfy $0 \leq X$, $0 \leq Y$, and $X+Y \leq 1$) and emits blue light may be used.

Fluorescent Member

The light-emitting device includes a fluorescent member containing the first fluorescent material and a resin. The fluorescent member, for example, covers the light-emitting element to form a light-emitting device. The details of the first fluorescent material are as described above, and preferred embodiments of the first fluorescent material are also as described above. Examples of the resin to be included in the fluorescent member include thermoplastic resins and thermosetting resins. Specific examples of thermosetting resins include modified silicone resins, such as epoxy resins, silicone resins, and epoxy-modified silicone resins. Examples of the silicone resin include at least one selected from the group consisting of methyl silicone, dimethyl silicone, methyl phenyl silicone, phenyl silicone, diphenyl silicone, and fluorosilicone.

The first fluorescent material content of the fluorescent member relative to the amount of the resin is, for example, 2% by mass or more, preferably 10% by mass or more, more preferably 40% by mass or more, and, for example, 190% by mass or less, preferably 160% by mass or less, and more preferably 130% by mass or less.

In addition to the first fluorescent material, the light-emitting device may include in the fluorescent member at least one second fluorescent material having a different peak emission wavelength from that of the first fluorescent material. The light-emitting device having the second fluorescent material can emit light of various color hues.

Specifically, the second fluorescent material can be a fluorescent material having a composition represented by any one of the following formulas (I) to (IX) below. These second fluorescent materials may be used alone or two or more in combination. As a second fluorescent material having a peak emission wavelength in the range of 500 nm to 580 nm, for example, at least one selected from the group consisting of the fluorescent materials represented by formulae (IV), (V), (VII), and (VIII) may be used. In particular, to produce a liquid crystal display with an improved color reproducibility, for example, selecting a fluorescent material having a composition represented by formula (V) or (VII) as a second fluorescent material to be included in the fluorescent member together with the first fluorescent material is preferable, rather than selecting a fluorescent material having a composition represented by formula (VIII). To produce a light-emitting device having high emission efficiency, selecting, as a second fluorescent material, a fluorescent material having a composition represented by formula (VIII) is preferable.

$(Ca_{1-p-q}Sr_pEu_q)AlSiN_3$ (I)

In formula (I), p and q satisfy $0 \leq p \leq 1$, $0 < q < 1$, and $p+q < 1$.

$(Ca_{1-r-s-t}Sr_rBa_sEu_t)_2Si_5N_8$ (II)

In formula (II), r, s, and t satisfy 0≤r≤1, 0≤s≤1, 0<t<1, and r+s+t<1.

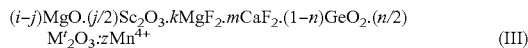
$(i-j)MgO.(j/2)Sc_2O_3.kMgF_2.mCaF_2.(1-n)GeO_2.(n/2)$
$M'_2O_3:zMn^{4+}$     (III)

In formula (III), M' is at least one selected from the group consisting of Al, Ga, and In; and j, k, m, n, and z each satisfy 2≤i≤4, 0<k<1.5, 0<z<0.05, 0<j<0.5, 0<n<0.5, and 0<m<1.5.

$M^{11}{}_8MgSi_4O_{16}X^{11}{}_2:Eu$     (IV)

In formula (IV), $M^{11}$ is at least one selected from the group consisting of Ca, Sr, Ba, and Zn; and $X^{11}$ is at least one selected from the group consisting of F, Cl, Br, and I.

$Si_{6-z}Al_zO_zN_{8-z}:Eu$     (V)

In formula (V), z satisfies 0<z<4.2.

$M_{m/n}Si_{12-(m+n)}Al_{(m+n)}O_nN_{(16-n)}:Eu$     (VI)

In formula (VI), M is at least one selected from the group consisting of Sr, Ca, Li, and Y; n is 0 to 2.5; m is 0.5 to 5; n is an electric charge of M; and x is 0.75 to 1.5.

$M^{13}Ga_2S_4:Eu$     (VII)

In formula (VII), $M^{13}$ is at least one selected from the group consisting of Mg, Ca, Sr, and Ba.

$(Y,Gd,Tb,Lu)_3(Al,Ga)_5O_{12}:Ce$     (VIII)

$M^a{}_VM^b{}_WM^c{}_XAl_{3-y}Si_yN_z$     (IX)

In formula (IX), $M^a$ is at least one element selected from the group consisting of Ca, Sr, Ba, and Mg; $M^b$ is at least one element selected from the group consisting of Li, Na, and K; $M^c$ is at least one element selected from the group consisting of Eu, Ce, Tb, and Mn; and v, w, x, y, and z each satisfy 0.80≤v≤1.05, 0.80≤w≤1.05, 0.001<x≤0.1, 0<y≤0.5, 3≤z≤5.

When the light-emitting device includes a fluorescent member containing a second fluorescent material and a resin, the second fluorescent material content relative to the amount of the resin is, for example, 1% by mass or more, preferably 5% by mass or more, and more preferably 10% by mass or more, and, for example, 200% by mass or less, preferably 150% by mass or less, and more preferably 100% by mass or less.

The fluorescent member may include other components as appropriate, in addition to the fluorescent material and the resin. Examples of the other components include a filler, such as silica, barium titanate, titanium oxide, and aluminium oxide; a light stabilizer; and a colorant. When the fluorescent member includes other components, the amount to be contained may be appropriately selected in accordance with the purpose, for example. When, for example, a filler is included as one of such other components, the amount to be contained may be 0.01% by mass to 20% by mass relative to the resin.

EXAMPLES

The present invention will now be described with reference to the Examples below; however, the present invention is not limited to these Examples.

Method for Producing Fluorescent Material Particles 16.25 g of $K_2MnF_6$ was weighed and dissolved into 1000 g of a 55% by mass HF aqueous solution to prepare Solution A. 195.10 g of $KHF_2$ was weighed and dissolved into 200 g of a 55% by mass HF aqueous solution to prepare Solution B. 450 g of a 40% by mass $H_2SiF_6$ aqueous solution was weighed and used as Solution C. Subsequently, Solution B and Solution C were each added dropwise to Solution A with stirring at room temperature over about 20 min. The resulting precipitate was solid-liquid separated, and then washed with isopropyl alcohol (IPA) and dried at 70° C. for 10 hours to prepare fluorescent material particles (core particles) containing a fluoride having a composition represented by formula (1).

Example 1

102.6 g of a sodium salt solution of phosphoric acid (phosphoric acid concentration: 2.4% by mass) and 2.5 g of a 30% by mass hydrogen peroxide solution were placed in a beaker. To this, pure water was added to make a total weight of 150 g. Into this, 50 g of the prepared core particles was introduced with stirring to obtain a fluorescent material slurry. To this fluorescent material slurry, 20 g of a lanthanum nitrate solution (lanthanum concentration: 5.0% by mass) was added and stirred well. Lanthanum phosphate was observed to be precipitated in the fluorescent material slurry. The fluorescent material slurry was then dehydrated by filtering, and dried to obtain Fluorescent material 1 as intended. Lanthanum adhering to Fluorescent material 1 in the form of lanthanum phosphate constituted 1.1% by mass of Fluorescent material 1.

Example 2

256.4 g of a sodium salt solution of phosphoric acid (phosphoric acid concentration: 2.4% by mass) and 2.5 g of a 30% by mass hydrogen peroxide solution were placed in a beaker. Into this, 50 g of the prepared core particles was introduced with stirring to obtain a fluorescent material slurry. To this fluorescent material slurry, 50 g of a lanthanum nitrate solution (lanthanum concentration: 5.0% by mass) was added and stirred well. Lanthanum phosphate was observed to be precipitated in the fluorescent material slurry. The fluorescent material slurry was then dehydrated by filtering, and dried to obtain Fluorescent material 2 as intended. Lanthanum adhering to Fluorescent material 2 in the form of lanthanum phosphate constituted 2.9% by mass of Fluorescent material 2.

Example 3

Fluorescent material 3 was obtained in the same manner as Example 2 except that the amount of the sodium salt solution of phosphoric acid (phosphoric acid concentration: 2.4% by mass) was changed to 512.8 g; and that the amount of the lanthanum nitrate solution (lanthanum concentration: 5.0% by mass) was changed to 100 g. Lanthanum adhering to Fluorescent material 3 in the form of lanthanum phosphate constituted 4.8% by mass of Fluorescent material 3.

Example 4

Fluorescent material 4 was obtained in the same manner as Example 3 except that the amount of the sodium salt solution of phosphoric acid (phosphoric acid concentration: 2.4% by mass) was changed to 1025.6 g; and that the amount of the lanthanum nitrate solution (lanthanum concentration: 5.0% by mass) was changed to 200 g. Lanthanum adhering to Fluorescent material 4 in the form of lanthanum phosphate constituted 6.7% by mass of Fluorescent material 4.

Comparative Example 1

As Fluorescent material C1 of Comparative Example 1, the prepared core particles were used as they are.

Comparative Example 2

100 g of the core particles and 9.5 g of calcium pyrophosphate powder were added to 180 g of ethanol, and were suspended therein. To this, 36.0 g of pure water and 36.0 g of Si(OEt)$_4$ were added, and 43.2 g of ammonia water was further added as a catalyst to cause hydrolysis. Subsequently, dehydration and drying treatments were carried out, and Fluorescent material C2 was obtained. Fluorescent material C2 includes the fluorescent material particles whose surfaces are coated with calcium pyrophosphate using silica dioxide by sol-gel method. Calcium adhering to Fluorescent material C2 in the form of calcium phosphate constituted 2.0% by mass of Fluorescent material C2.

Example 5

25.64 g of a sodium salt solution of phosphoric acid (phosphoric acid concentration: 2.4% by mass) and 2.5 g of a 30% by mass hydrogen peroxide solution were placed in a beaker. To this, pure water was added to make a total weight of 150 g. Into this, 50 g of the prepared core particles was introduced with stirring to obtain a fluorescent material slurry. To this fluorescent material slurry, 30 g of a lanthanum nitrate solution (lanthanum concentration: 5.0% by mass) was added and stirred well. Lanthanum phosphate was observed to be precipitated in the fluorescent material slurry. The fluorescent material slurry was then dehydrated by filtering, and dried to obtain Fluorescent material 5 as intended. Lanthanum adhering to Fluorescent material 5 in the form of lanthanum phosphate constituted 2.3% by mass of Fluorescent material 5.

Example 6

Fluorescent material 6 was obtained in the same manner as Example 5 except that the amount of the sodium salt solution of phosphoric acid (phosphoric acid concentration: 2.4% by mass) was changed to 51.28 g; that pure water was added to make a total weight of 300 g; and that the amount of the lanthanum nitrate solution (lanthanum concentration: 5.0% by mass) was changed to 60 g. Lanthanum adhering to Fluorescent material 6 in the form of lanthanum phosphate constituted 5.2% by mass of Fluorescent material 6.

Example 7

Fluorescent material 7 was obtained in the same manner as Example 5 except that the amount of the sodium salt solution of phosphoric acid (phosphoric acid concentration: 2.4% by mass) was changed to 76.91 g; that pure water was added to make a total weight of 450 g; and that the amount of the lanthanum nitrate solution (lanthanum concentration: 5.0% by mass) was changed to 90 g. Lanthanum adhering to Fluorescent material 7 in the form of lanthanum phosphate constituted 7.6% by mass of Fluorescent material 7.

Example 8

Fluorescent material 8 was obtained in the same manner as Example 5 except that the amount of the sodium salt solution of phosphoric acid (phosphoric acid concentration: 2.4% by mass) was changed to 102.55 g; that pure water was added to make a total weight of 600 g; and that the amount of the lanthanum nitrate solution (lanthanum concentration: 5.0% by mass) was changed to 120 g. Lanthanum adhering to Fluorescent material 8 in the form of lanthanum phosphate constituted 9.7% by mass of Fluorescent material 8.

Example 9

Fluorescent material 9 was obtained in the same manner as Example 5 except that the amount of the sodium salt solution of phosphoric acid (phosphoric acid concentration: 2.4% by mass) was changed to 128.19 g; that pure water was added to make a total weight of 750 g; and that the amount of the lanthanum nitrate solution (lanthanum concentration: 5.0% by mass) was changed to 150 g. Lanthanum adhering to Fluorescent material 9 in the form of lanthanum phosphate constituted 12.0% by mass of Fluorescent material 9.

Preparation of Light-Emitting Device a

Light-emitting devices a, or Examples 1a to 4a and Comparative Examples 1a and 2a, were prepared respectively using Fluorescent materials 1 to 4 obtained in Examples 1 to 4 and Fluorescent materials C1 and C2 obtained in Comparative Examples 1 and 2, with another fluorescent material (second fluorescent material) having a composition of $Y_3Al_5O_{12}$:Ce in a manner as described below.

The ratio of each first fluorescent material, Fluorescent material 1, 2, 3, or 4, or C1 or C2, to the second fluorescent material was adjusted to allow the light emitted by the light-emitting device a to have chromaticity coordinates around x=0.380 and y=0.380. Each first fluorescent material and the second fluorescent material were added to a silicone resin, mixed and dispersed, and then defoamed to have a resin composition. The resin composition was then poured onto a light-emitting element in an LED package (peak emission wavelength: 455 nm) to fill the recess, followed by heating at 150° C. for 4 hours to cure the resin composition.

Durability Evaluation

The resultant light-emitting devices a were lighted continuously with an electric current of 250 mA in an environment tester at a temperature as high as 85° C. The evaluation was made by determining the amounts of differences, Δx, Δy, in values x and y in chromaticity coordinates between their initial values and the values after 700 hours of lighting. In the same manner, the relative light flux of each light-emitting device was also evaluated. A relative light flux as used herein is a value of the light flux after 700 hours of lighting relative to the initial value of the light flux, taking the initial value as 100. Table 1 shows the evaluation results.

TABLE 1

| Light emitting device | Fluorescent material | Content of La (mass %) | 700 hr (85° C., 250 mA) Δx | Δy | Relative light flux (%) |
|---|---|---|---|---|---|
| Example 1a | Fluorescent material 1 | 1.1 | −0.01 | 0 | 81 |
| Example 2a | Fluorescent material 2 | 2.9 | −0.01 | 0 | 67 |
| Example 3a | Fluorescent material 3 | 4.8 | −0.01 | 0 | 80 |
| Example 4a | Fluorescent material 4 | 6.7 | −0.01 | 0 | 76 |
| Comparative Example 1a | Fluorescent material C1 | — | 0.04 | 0.07 | 59 |
| Comparative Example 2a | Fluorescent material C2 | — | −0.01 | 0.01 | 80 |

Table 1 shows that in each of the light-emitting devices of Examples 1a to 4a, Δy is zero, that is, there is no change in the value y from the initial value in chromaticity coordinates. This indicates that the light-emitting devices of Examples 1a to 4a are more durable than Comparative Examples 1a and 2a. Examples 1a to 4a only differ from Comparative Example 2a in value Δy by the amount of 0.01 numerically. However, this difference in color tone is significant to the naked eye.

Figure 1B:
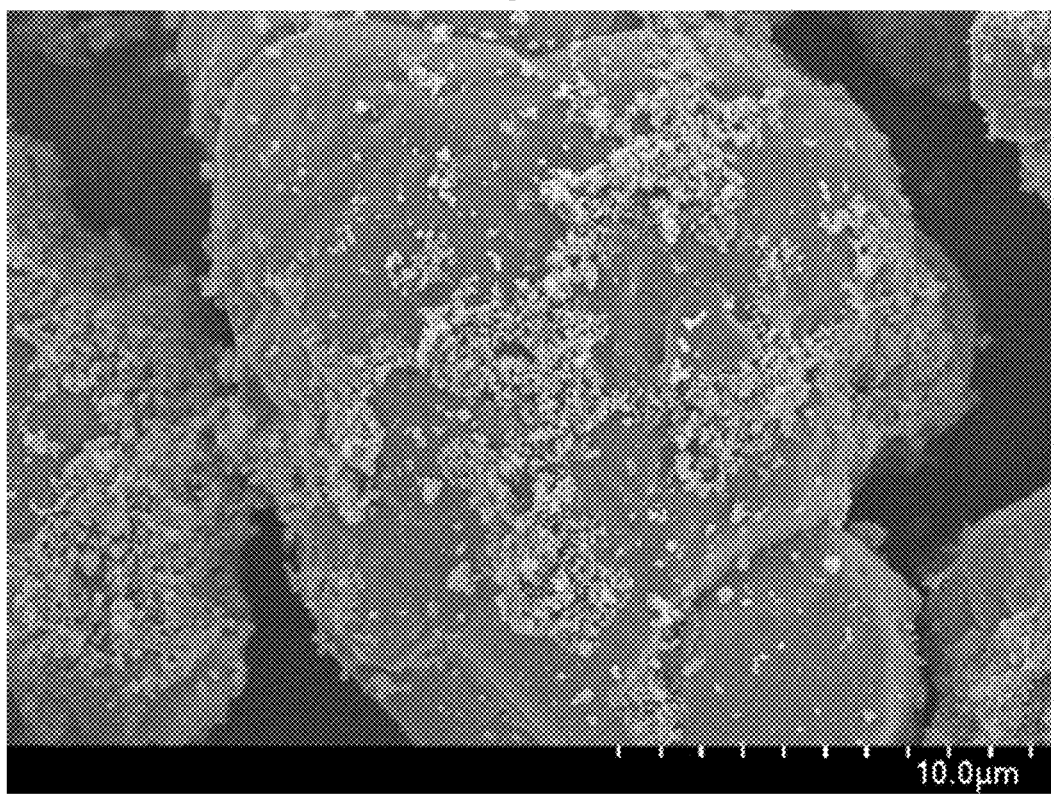
FIG. 1B is a partially enlarged view of FIG. 1A.
Figure 2A:
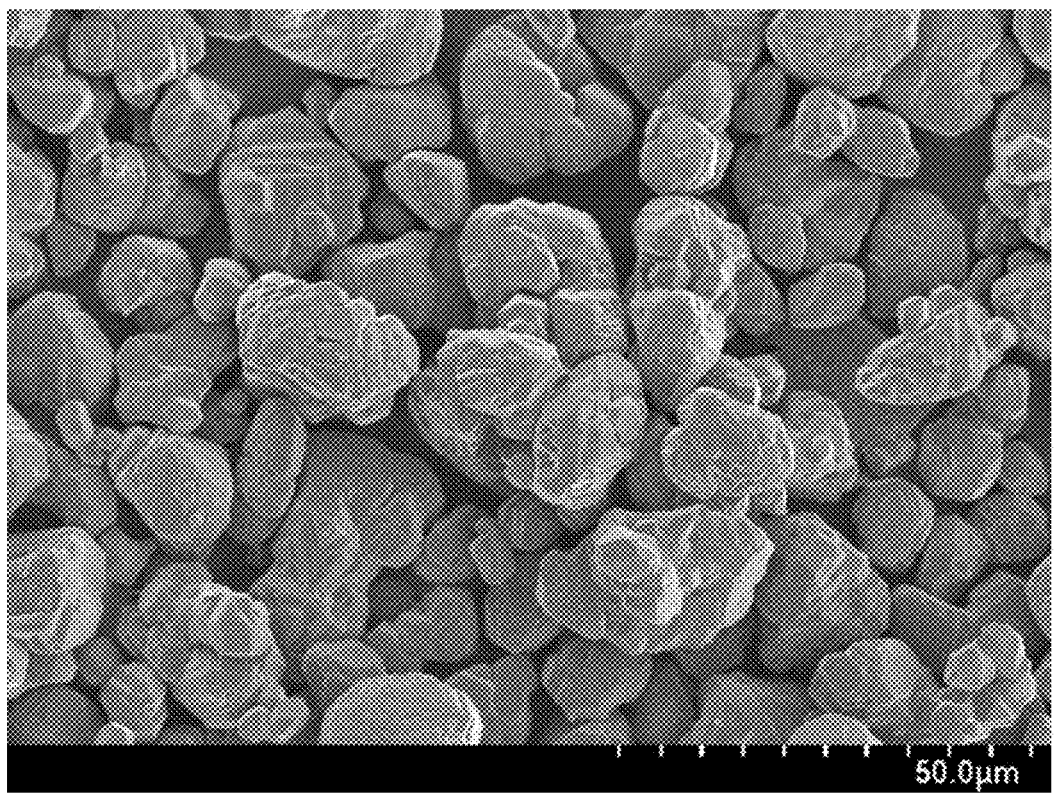
FIG. 2A is an SEM image of a comparative fluorescent material.
Figure 2B:
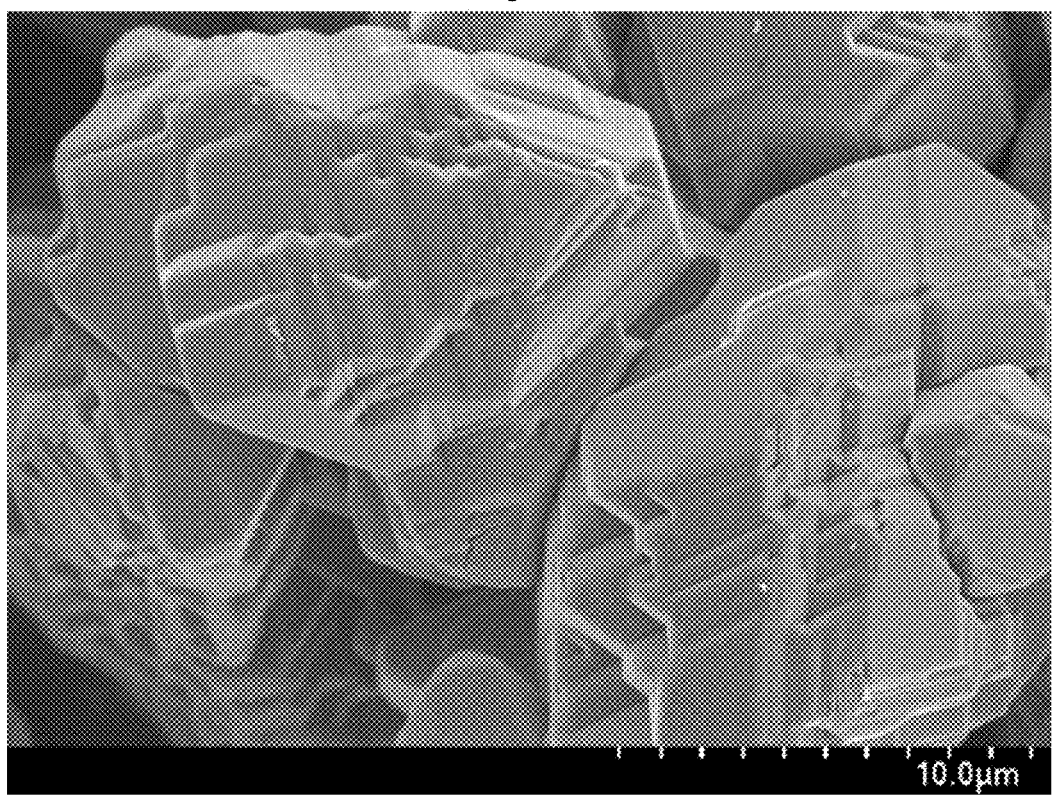
FIG. 2B is a partially enlarged view of FIG. 2A.

FIGS. 1A and 1B show SEM images of Fluorescent material 1, and FIGS. 2A and 2B show SEM images of Fluorescent material C1. Comparison of FIGS. 1A and 1B with FIGS. 2A and 2B shows that lanthanum phosphate is adhered to the surfaces of the core particles in the form of at least particles or a film in Fluorescent material 1. This structure causes strong adhesion between Fluorescent material 1 and the resin in the fluorescent member, and this strong adhesion is considered to be responsible for high durability of the light-emitting devices including the fluorescent member.

Preparation of Light-Emitting Device b

Light-emitting devices b, or Examples 5b to 9b and Comparative Example 1b, were prepared respectively using Fluorescent materials 5 to 9 obtained in Examples 5 to 9 and Fluorescent material C1 obtained in Comparative Example 1, with another fluorescent material (second fluorescent material) having a composition of $Sr_{0.88}Eu_{0.12}Ga_2S_4$ in a manner as described below.

The ratio of each first fluorescent material, i.e., Fluorescent material 5, 6, 7, 8, or 9 or C1, to the second fluorescent material was adjusted to allow the light emitted by the light-emitting device to have chromaticity coordinates around x=0.280, y=0.270. Each first fluorescent material, the second fluorescent material, and nanoparticles of silica were added to a silicone resin, mixed and dispersed, and then defoamed to have a resin composition. The resin composition was then poured onto a light-emitting element in an LED package (peak emission wavelength: 455 nm) to fill the recess. The resin composition then underwent centrifugal sedimentation to allow the fluorescent material particles to settle. Further, the resin composition was cured with heating at 150° C. for 4 hours.

Durability Evaluation

The resultant light-emitting devices b were stored in an environment tester at a temperature of 85° C. and a relative humidity of 85% without lighting them. After 1000 hours of storage, the light-emitting devices b were lighted with an electric current of 20 mA. The evaluation was made by determining the amounts of difference, Δx, Δy, between their initial values x and y in chromaticity coordinates before storage and after 1000 hours of storage. In the same manner, the relative light flux of each light-emitting device was also evaluated. A relative light flux as used herein is a value of the light flux after 1000 hours of storage relative to the initial value of the light flux, taking the initial value as 100. Table 2 shows the evaluation results.

TABLE 2

| Light emitting device | Fluorescent material | 1000 hr (85° C., 85% RH) | | | |
|---|---|---|---|---|---|
| | | Content of La (mass %) | Δx | Δy | Relative light flux (%) |
| Example 5b | Fluorescent material 5 | 2.3 | −0.003 | −0.008 | 89 |
| Example 6b | Fluorescent material 6 | 5.2 | −0.001 | −0.004 | 91 |
| Example 7b | Fluorescent material 7 | 7.6 | −0.001 | −0.001 | 94 |
| Example 8b | Fluorescent material 8 | 9.7 | −0.001 | 0.000 | 93 |
| Example 9b | Fluorescent material 9 | 12.0 | −0.002 | −0.004 | 92 |
| Comparative Example 1b | Fluorescent material C1 | — | −0.003 | −0.011 | 88 |

Table 2 shows that in each of the light-emitting devices of Examples 5b to 9b, the absolute value of Δy is smaller than that of Comparative Example 1b. That is, the change in value y from the initial value in chromaticity coordinates is smaller. This indicates that the light-emitting devices of Examples 5b to 9b have higher storage durability than Comparative Example 1b in an environment at a high temperature with a high humidity. The relative light fluxes are also higher than that of Comparative Example 1b.

The production method according to the present disclosure provides a highly durable fluorescent material. The fluorescent material of the present disclosure can be used for a light-emitting device, and a highly durable light-emitting device according to the present disclosure may be used in a variety of applications including displays, light sources for backlighting, general lighting, in-vehicle lighting, using a light-emitting diode as an excitation light source.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Although the present disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for producing a fluorescent material comprising:
   preparing fluorescent material particles comprising a fluoride having a composition comprising Mn, at least one selected from the group consisting of alkali metal elements and NH$_4^+$, and at least one selected from the group consisting of Group 4 elements and Group 14 elements;
   mixing the fluorescent material particles and a liquid medium comprising a phosphate ion and a reducing agent to obtain a liquid medium containing the fluorescent material particles;
   causing at least one cation selected from rare-earth elements and the phosphate ion to come into contact with each other in the liquid medium containing the fluorescent material particles to obtain rare-earth phosphate-adhered fluorescent material particles including the fluorescent material particles to which the rare-earth phosphate is adhered; and
   separating the rare-earth phosphate-adhered fluorescent material particles from the liquid medium,
   wherein the reducing agent comprises hydrogen peroxide.

2. The method according to claim 1, wherein the liquid medium comprises the phosphate ion, and the liquid medium and a solution containing the cation are mixed to cause the cation and the phosphate ion to come into contact with each other.

3. A fluorescent material comprising:
   fluorescent material particles comprising a fluoride having a composition comprising Mn; at least one selected from the group consisting of alkali metal elements and NH$_4^+$; and at least one selected from the group consisting of Group 4 elements and Group 14 elements; and
   a rare-earth phosphate arranged on the fluorescent material particles,
   wherein the composition is represented by formula (1):

$$A_2[M_{1-p}Mn^{4+}{}_pF_6] \tag{1}$$

wherein A is at least one selected from the group consisting of alkali metal elements and NH$_4^+$; M is at least one selected from the group consisting of Group 4 elements and Group 14 elements; and p satisfies 0<p<0.2.

4. The fluorescent material according to claim 3, wherein the composition comprises at least K and Si.

5. The fluorescent material according to claim 3, wherein the rare-earth phosphate comprises lanthanoid.

6. The fluorescent material according to claim 5, wherein the lanthanoid is at least one selected from the group consisting of La, Ce, Dy, and Gd.

7. The fluorescent material according to claim 3, wherein the rare-earth metal element content of the rare-earth phosphate ranges from 0.1% by mass to 20% by mass.

8. A light-emitting device comprising:
   a fluorescent member comprising a first fluorescent material and a resin; and a light-emitting element having a peak emission wavelength in a wavelength range of 380 nm to 470 nm,
      wherein the first fluorescent material comprises the fluorescent material according to claim 3.

9. The light-emitting device according to claim 8, wherein the fluorescent member further comprises a second fluorescent material having a peak emission wavelength in a wavelength range of 500 nm to 580 nm.

10. A method for producing a fluorescent material comprising:
    preparing fluorescent material particles comprising a fluoride having a composition comprising Mn, at least one selected from the group consisting of alkali metal elements and NH$_4^+$, and at least one selected from the group consisting of Group 4 elements and Group 14 elements;
    causing at least one cation selected from rare-earth elements and a phosphate ion to come into contact with each other in a liquid medium containing the fluorescent material particles to obtain rare-earth phosphate-adhered fluorescent material particles including the fluorescent material particles to which the rare-earth phosphate is adhered; and
    separating the rare-earth phosphate-adhered fluorescent material particles from the liquid medium,
    wherein the fluoride has a composition represented by formula (1):

$$A_2[M_{1-p}Mn^{4+}{}_pF_6] \tag{1}$$

wherein A is at least one selected from the group consisting of alkali metal elements and NH$_4^+$; M is at least one selected from the group consisting of Group 4 elements and Group 14 elements; and p satisfies 0<p<0.2.

11. The method according to claim 10, wherein the liquid medium comprises the phosphate ion, and the liquid medium and a solution containing the cation are mixed to cause the cation and the phosphate ion to come into contact with each other.

12. The method according to claim 10, further comprising mixing the fluorescent material particles and a liquid medium comprising the phosphate ion and a reducing agent to obtain the liquid medium containing the fluorescent material particles.

13. The method according to claim 12, wherein the reducing agent comprises hydrogen peroxide.

* * * * *